US010669478B2

(12) United States Patent
Oepts et al.

(10) Patent No.: US 10,669,478 B2
(45) Date of Patent: Jun. 2, 2020

(54) WHITE LIGHTING DEVICE FOR RETAIL ILLUMINATION

(71) Applicant: SIGNIFY HOLDING B.V., Eindhoven (NL)

(72) Inventors: Wouter Oepts, Eindhoven (NL); Martinus Petrus Joseph Peeters, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/770,601

(22) PCT Filed: Oct. 12, 2016

(86) PCT No.: PCT/EP2016/074452
§ 371 (c)(1),
(2) Date: Apr. 24, 2018

(87) PCT Pub. No.: WO2017/071954
PCT Pub. Date: May 4, 2017

(65) Prior Publication Data
US 2019/0055468 A1 Feb. 21, 2019

(30) Foreign Application Priority Data
Oct. 29, 2015 (EP) .................................... 15192045

(51) Int. Cl.
*H01L 33/50* (2010.01)
*C09K 11/77* (2006.01)
(Continued)

(52) U.S. Cl.
CPC .......... *C09K 11/7743* (2013.01); *C09K 11/08* (2013.01); *F21V 9/30* (2018.02);
(Continued)

(58) Field of Classification Search
CPC ............. F21V 9/30; F21V 9/38; H01L 33/504
See application file for complete search history.

(56) References Cited

U.S. PATENT DOCUMENTS

| 2004/0217364 | A1 | 11/2004 | Tarsa et al. | |
| 2011/0248303 | A1* | 10/2011 | Suzuki ............... | C09K 11/7734 |
| | | | | 257/98 |

(Continued)

FOREIGN PATENT DOCUMENTS

| WO | WO2013150470 A1 | 10/2013 | |
| WO | WO-2014068440 A1 * | 5/2014 | ........... H01L 33/504 |

(Continued)

OTHER PUBLICATIONS

S. Jost-Boissard, et al., "Assessing the color quality of LED sources: Naturalness, attractiveness, colourfulness and colour difference", Lighting Res. Technol. 2014; 0: pp. 1-26.

(Continued)

*Primary Examiner* — Donald L Raleigh
(74) *Attorney, Agent, or Firm* — Akarsh P. Belagodu

(57) ABSTRACT

The invention provides a lighting device (100) comprising a solid state light source (10) configured to provide blue light (11) having a dominant wavelength selected from the range of 440-490 nm, a first luminescent material (210) configured to convert part of the blue light (11) into first luminescent material light (211) having intensity in one or more of the green and yellow having a CIE u' (211), and a second luminescent material (220) configured to convert part of one or more of the blue light (11) and the first luminescent material light (211) into second luminescent material light (221) having intensity in one or more of the orange and red having a CIE u' (221), wherein the first luminescent material (210) and the second luminescent material (220) are selected to provide said first luminescent material light (211) and said second luminescent material light (221) defined by a maxi- (Continued)

mum ratio of CIE u' (211) and CIE u' (221) being CIE u'(221)=1.58*CIE u'(211)+0.255, and a minimum ratio of CIE u' (211) and CIE u' (221) being CIE u'(221)=2.3*CIE u'(211)+0.04.

16 Claims, 6 Drawing Sheets

(51) Int. Cl.
  *F21V 9/38*   (2018.01)
  *C09K 11/08*  (2006.01)
  *F21V 9/30*   (2018.01)
  *F21Y 115/10*  (2016.01)

(52) U.S. Cl.
  CPC .............. *F21V 9/38* (2018.02); *H01L 33/504* (2013.01); *H01L 33/507* (2013.01); *F21Y 2115/10* (2016.08)

(56) References Cited

U.S. PATENT DOCUMENTS

| | | |
|---|---|---|
| 2015/0049459 A1 | 2/2015 | Peeters et al. |
| 2015/0380460 A1* | 12/2015 | Horie .................. H05B 33/086 257/89 |
| 2016/0223146 A1* | 8/2016 | Vick .................. F21K 9/64 |
| 2016/0308097 A1* | 10/2016 | Horie .................. H01L 33/504 |

FOREIGN PATENT DOCUMENTS

| | | |
|---|---|---|
| WO | WO2014068440 A1 | 5/2014 |
| WO | WO2015015363 A1 | 2/2015 |
| WO | WO20150660099 A2 | 5/2015 |

OTHER PUBLICATIONS

ANSI, "Specifications for the Chromaticity of Solid State Lighting Products", Approved Oct. 6, 2011, pp. 1-21.
ANSI, "Specifications for the Chromaticity of Solid State Lighting Products", Approved Feb. 1, 2001, pp. 1-23.
CIE, "Method of Measuring and Specifying Colour Rendering Properties of Light Sources", 1995, ISBN3900734577, pp. 1-24.
Energy Star, "Program Requirements for Lamps—Eligibility Criteria", Rev. Aug. 2014, pp. 1-25.
EU, "Commission Regulation (EU) No. 244/2009", Official Journal of the European Union, Mar. 18, 2009, pp. L76/3-L76/16.
EU, "Commission Regulation (EU) No. 245/2009", Official Journal of the European Union, Mar. 18, 2009, pp. L76/17-L76/44.
EU, "Commission Regulation (EU) No. 347/2010", Official Journal of the European Union, Apr. 21, 2010, pp. L104/20-L104/28.
EU, "Commission Regulation (EU) No. 1194/2012", Official Journal of the European Union, Dec. 12, 2012, pp. L34211-L342/22.
CEI IEC 60081, International Standard, "Double-capped fluorescent lamps—Performance specifications", May 2002, pp. 1-364.
MS ISO 8995:2005, "Development of Malaysian Standards", 2005, pp. 1-36.
Y. Ohno, et al., "Vision Experiment on chroma Saturation for Color Quality Preference", Proceed. of 28th CIE Session, 2015, pp. 1-10.
J.P. Freyssinier, et al., "The Class A Color Designation for Light Sources", RPI, 2013 DOE Solid-State Lighting R&D Workshop, Jan. 29-31, 2013, Hilton Long Beach, CA, USA, pp. 1-26.

* cited by examiner

WHITE LIGHTING DEVICE FOR RETAIL ILLUMINATION

CROSS-REFERENCE TO PRIOR APPLICATIONS

This application is the U.S. National Phase application under 35 U.S.C. § 371 of International Application No. PCT/EP2016/074452, filed on Oct. 12, 2016, which claims the benefit of European Patent Application No. 15192045.1, filed on Oct. 29, 2015. These applications are hereby incorporated by reference herein.

FIELD OF THE INVENTION

The invention relates to a lighting device, a lighting system comprising such lighting device, as well as the use of such lighting device.

BACKGROUND OF THE INVENTION

White lighting devices are known in the art. WO2013/150470, for instance, describes a light emitting module adapted to produce white output light having an emission peak in the wavelength range from 400 to 440 nm, which comprises at least one first light emitting element adapted to emit light having an emission peak in a first wavelength range from 440 to 460 nm, at least one wavelength converting material arranged to receive light emitted by said first light emitting element, and being capable of emitting light having an emission peak in the green to red wavelength range, and at least one second light emitting element adapted to emit light having an emission peak in a second wavelength range from 400 to 440 nm. Such module provides white light with a "crisp white" effect.

WO2014/068440 describes a lighting unit comprising a source of blue light, a source of green light, a first source of red light comprising a first red luminescent material, configured to provide red light with a broad band spectral light distribution, and a second source of red light comprising a second red luminescent material, configured to provide red light with a spectral light distribution comprising one or more red emission lines. Especially, the first red luminescent material comprises $(Mg,Ca,Sr)AlSiN_3$:Eu and/or $(Ba,Sr,Ca)_2Si_{5-x}A_{1x}O_xN_{8-x}$:Eu, and the second red luminescent material comprises $K_2SiF_6$:Mn. Amongst others, this document describes a LCD display device comprising such lighting unit according any one of the preceding claims configured as backlighting unit. Further, the documents describes that for backlighting purposes the correlated color temperature is especially in the range of about 7000 K and 20000 K.

SUMMARY OF THE INVENTION

For retail lighting, often CDM (ceramic discharge metal halide) lighting is applied. The CDM technology has been massively adopted for illumination of merchandise in shops.

Key for adoption of alternative lighting devices seem a high efficiency (especially >100 lm/W) and a high color rendering (especially CRI≥90) and optimal white perception (which is achieved in WO2013/150470 by excitation of optical brightness agents via the deep blue wavelengths in the lamp emission spectrum).

With the introduction of LEDs, replacement of the above CDM technology is possible. The main LED light source applied in Retail lighting is Chip on Board (CoB). The small diameter (light emitting source) of the CoB enables spot lighting with narrow beam angles. However, general acceptance of these LED solutions has been hampered by lagging of efficiency, color and white perception.

A breakthrough in LED lighting for Retail has been the invention of Crisp White in WO2013/150470 (see also above). The addition of a deep blue emission peak excites the optical brightening agents, present in white fabrics, paint and plastics. That results in a strongly improved whiteness perception. This Crisp White source is accepted in the market as the replacement of CDM in terms of whiteness and color rendering.

It appears that an alternative to adding deep blue light to the emission spectrum is to change the color point of the emitted source to a color point much below BBL. The mainstream Retail Lighting CCT is 3000K, and a concomitant color point is significantly below the Black Body Line (black body locus (BBL)), such as CIE y at least 0.05 below the BBL (CIE 1931). Good results can be obtained with color temperatures in the range of about 2500-3500 K and with CIE y (thus) at least 0.05 below the BBL (CIE 1931).

This allows providing a light source having a target color point below BBL with the emission spectrum not having the additional deep blue, as indicated above. Hence, the whiteness appreciation is not due to additional deep blue but due to the color point being lower with respect to the BBL.

A high CRI does not always provide the desired color perception. The use of the gamut area index seems useful to further characterize desired optical properties. The gamut of the colors rendered by the light source can be measured by a metric known as Gamut Area Index (GAI or $G_a$). If the color points used to calculate CRI are connected in a two dimensional space, the bounded area they form is the gamut area. A higher GAI results in saturation of colors.

Rendering the colors used in CRI with a black body radiator, at a CCT of 3000K, will produce a CRI of 100. For any light source that does not render the color points exactly as rendered by the black body radiator, CRI will be less than 100. Connecting the rendered color points will form a gamut area.

Gamut Area Index is calculated by dividing the gamut area formed by the light source with the gamut area formed by the reference source using the same set of colors that are used for CRI.

Despite its limitations, the general colour rendering index ($R_a$) is still the only CIE standardized and widely used index to rate the colour rendering properties of a light source. It is used by lighting manufacturers in product specification sheets, by national and international standards [1-7] and regulatory bodies [8-11] to set minimum requirements, and in rebate programs [12]. The general colour rendering index is a measure how accurate a lamp can reproduce the colour rendition for a defined set of test-colour samples in comparison to a reference illuminant with the same correlated colour temperature. Because only colour differences are calculated and averaged, $R_a$ will inevitably decrease with increasing colour differences, irrespective if the colors are reproduced more or less colorful in comparison to the reference illuminant. It would be beneficial to add, next to $R_a$, a second index that captures the average change in colorfulness.

Jost et al. (http://lrt.sagepub.com/cgi/reprint/1477153514555882v1.pdf?ijkey=blow1xbucFTGo5V&keytype=finite) (Ligthing Res. Technol. 2014; 0:1-26) have found that naturalness correlates best with fidelity based indices, like $R_a$, and object attractiveness correlates best with gamut area based indices. To enable making a direct trade-off between naturalness and attractiveness for a lamp to be tested, it is necessary to calculate the gamut area based index with same methodology and test-colour samples as used for calculating the general colour rendering index. To this end, the gamut area index shall be based on the method and procedure described in CIE publication 13.3-1995 [13], which is herein incorporated by reference. This section includes the method for calculating the relative gamut area index. In order to indicate that the relative gamut area index should best be used in conjunction with the general colour rendering index ($R_a$), the Relative Gamut Area Index is designated by the symbol $G_a$.

The procedure for calculating the relative gamut area index ($G_a$) is based on the rating procedure described in section 5 of CIE publication 13.3-1995 [13]. The gamut area for both the lamp to be tested and the reference illuminant must be calculated with the set of eight test-colour samples, for which the spectral radiance factors are specified in section 8, table 1, of CIE13.3-1995 [13]. For doing so, first the CIE 1931 tristimulus values of the eight test-colors must be determined for both the lamp to be tested and the reference illuminant. The next step is to transform these tristimulus values into coordinates of the 1960 UCS diagram.

The adaptive colour shift is accounted for by a Von Kries transformation with the fundamental primaries given by D. B. Judd (Proceedings of the National Academy of Sciences, 07/1966; 55(6):1313-30. DOI: 10.1073/pnas.55.6.1313).

The relative gamut area index is calculated in the 1960 uniform colour space.

With respect to the reference illuminant, the same procedure is employed as described in section 5.2 of CIE13.3-1995 [13].

With respect to the tolerances for reference illuminant, the same criteria shall be used as described in section 5.3 of CIE13.3-1995 [13].

With respect to the test-colour samples, only the set of eight test-colour samples described in section 5.4 (and section 8, table 1) of CIE13.3-1995 [13], shall be used.

With respect to the determination of CIE 1931 tristimulus values of the eight test-colour samples, the same procedure as specified in section 5.5 of CIE13.3-1995 [13] shall be used.

With respect to the transformation into 1960 UCS coordinates, the same procedure as specified in section 5.6 of CIE13.3-1995 [13] shall be used, but only for the eight test-colour samples specified in table 1 of section 8. This will provide the chromaticity coordinates for the eight test colour samples (i=1,8) in the 1960 uniform colour space for lamp to be tested ($u_{k,i}$, $v_{k,i}$) as well as for the reference illuminant ($u_{r,i}$, $v_{r,i}$).

With respect to the consideration of adaptive (perceived) colour shift, the same procedure as specified in section 5.7 of CIE13.3-1995 [13] shall be used, but only for the eight test-colour samples specified in table 1 of section 8. This will provide the chromaticity coordinates ($u'_{k,i}$, $v'_{k,i}$) for the eight test colour samples (i=1,8) in the 1960 uniform colour space for lamp to be tested (k) after considering the adaptive colour shift.

With respect to the determination of the gamut areas, the gamut area for the reference illuminant ($GA_{ref}$) shall be calculated with the chromaticity coordinates for the test-colour samples, illuminated with the reference illuminant (r), (see above) by using the following formulae:

$$GA_{ref}=((u_{r,1}\times v_{r,2})-(u_{r,2}\times v_{r,1})+(u_{r,2}\times v_{r,3})-(u_{r,3}\times v_{r,2})+\\(u_{r,3}\times v_{r,4})-(u_{r,4}\times v_{r,3})+(u_{r,4}\times v_{r,5})-(u_{r,5}\times v_{r,4})+\\(u_{r,5}\times v_{r,6})-(u_{r,6}\times v_{r,5})+(u_{r,6}\times v_{r,7})-(u_{r,7}\times v_{r,6})+\\(u_{r,7}\times v_{r,8})-(u_{r,8}\times v_{r,7})+(u_{r,8}\times v_{r,1})-(u_{r,1}\times v_{r,8}))/2$$

The gamut area for the lamp to be tested ($GA_{test}$) shall be calculated with the chromaticity coordinates for the test-colour samples, illuminated with the lamp to be tested (k), after considering the adaptive colour shift (see above) by using the following formulae:

$$GA_{test}=((u'_{k,1}\times v'_{k,2})-(u'_{k,2}\times v'_{k,1})+(u'_{k,2}\times v'_{k,3})-\\(u'_{k,3}\times v'_{k,2})+(u'_{k,3}\times v'_{k,4})-(u'_{k,4}\times v'_{k,3})+(u'_{k,4}\times\\v'_{k,5})-(u'_{k,5}\times v'_{k,4})+(u'_{k,5}\times v'_{k,6})-(u'_{k,6}\times v'_{k,5})+\\(u'_{k,6}\times v'_{k,7})-(u'_{k,7}\times v'_{k,6})+(u'_{k,7}\times v'_{k,8})-(u'_{k,8}\times\\v'_{k,7})+(u'_{k,8}\times v'_{k,1})-(u'_{k,1}\times v'_{k,8}))/2$$

The relative gamut area index ($G_a$) shall be calculated with the gamut area values for the reference illuminant ($GA_{ref}$) and for the lamp to be tested ($GA_{test}$) (see above) according to the following formulae:

$$G_a=100\times GA_{test}/GA_{ref}$$

The relative gamut area index ($G_a$) can be used in conjunction with the general colour rendering index ($R_a$) to disclose additional information on the colour rendering quality of a light source, based on the same set of test-colour samples. It reveals other information than disclosed by $R_a$. According to the work done by Jost et al., $R_a$ correlates well with naturalness, whereas gamut-based indices show a high correlation with attractiveness. Additional analysis on the data provided by Jost shows that $G_a$ also correlates well with attractiveness. In a two-dimensional ($R_a$-$G_a$) system one axis could be related to naturalness and the other axis to object attractiveness. Such a trade-off cannot easily be made when all information is condensed into one single average index value. Care shall be taken to generalize the findings of this experiment into areas of high naturalness and of high attractiveness, because the balance between naturalness and object attractiveness depends on the intended application [14]. Although the correlation between object attractiveness and Ga is on average high, there is a limit to the amount of increase in gamut area [15], in particular for skin tone rendering one should be careful [14]. Furthermore, a high fidelity ($R_a$) score does not necessarily mean a natural rendition of objects.

As indicated above, the procedure for calculating the relative gamut area index ($G_a$) is described. It should best be used in conjunction with $R_a$ to indicate the origin for a lower fidelity score, i.e., larger or smaller colour gamut compared to the reference source. However, also $G_a$ summarizes all colour shifts into one single number, whereas a relatively small shift for a specific colour may be more important for a specific application than relatively larger shifts for other colors. A graphical representation provides a comprehensive overview on the changes in colorfulness and hue shifts for all individual colors used to determine index values $R_a$ and $G_a$. It is supplementary and helps in making more informed design decisions.

The procedure for calculating the general colour rendering graphic is based on the methodology described in the previous section (see above). Starting points are the chromaticity coordinates for the reference illuminant ($u_{r,i}$, $v_{r,i}$) determined with the procedure described above and the chromaticity coordinates for the lamp to be tested after considering the adaptive colour shift ($u'_{k,i}$, $v'_{k,i}$) determined with the procedure described above. The chromaticity coordinates shall first be transformed from the CIE 1960 UCS to more perceptually uniform CIE 1976 UCS by means of the following formulae:

$$u'=u, v'=1.5\times v$$

Subsequently, the distance from the white-point to each of the chromaticity coordinates of the eight test-colour samples shall be calculated. The chromaticity coordinates of the lamp to be tested shall be close to the black body locus as specified above (section 5.3 of CIE13.3-1995). Therefore, the chromaticity coordinates of the white point of the lamp to be tested, after consideration of adaptive colour shift, are equal to the chromaticity coordinates of the reference illuminant ($u'_{wr}$, $v'_{wr}$). For all eight test-colour samples (i), the distance to reference white point shall be determined by using the following formulae:

$$\Delta u'_{r,i} = u'_{r,i} - u'_{wr} \text{ and } \Delta v'_{r,i} = v'_{r,i} - v'_{wr} \text{ for the reference source } (r)$$

$$\Delta u'_{k,i} = u'_{k,i} - u'_{wr} \text{ and } \Delta v'_{k,i} = v'_{k,i} \times 1.5 - v'_{wr} \text{ for the lamp to be tested } (k)$$

For the lamp to be tested, symbol $v'_{k,i}$ is already specified above. Therefore, this value shall be multiplied with 1.5 to transform it from the CIE 1960 UCS to CIE 1976 UCS.

To enable comparison of the relative colour shifts for the lamp to be tested, compared to the reference illuminant, the distances from the reference white point ($u'_{wr}$, $v'_{wr}$) shall first be normalized to unity for all individual test-colour samples (i) illuminated with the reference illuminant (r). Subsequently, the distances from ($u'_{wr}$, $v'_{wr}$) to the chromaticity coordinates for the test-colour samples (i), illuminated with the test lamp (k), shall be scaled accordingly according to the following formulae:

$$\Delta u'_{N,r,i} = \Delta u'_{r,i} / (\Delta u'^2_{r,i} + \Delta v'^2_{r,i})^{0.5}, \Delta v'_{N,r,i} = \Delta v'_{r,i} / (\Delta u'^2_{r,i} + \Delta v'^2_{r,i})^{0.5}$$

$$\Delta u'_{N,k,i} = \Delta u'_{k,i} / (\Delta u'^2_{r,i} + \Delta v'^2_{r,i})^{0.5}, \Delta v'_{N,k,i} = \Delta v'_{k,i} / (\Delta u'^2_{r,i} + \Delta v'^2_{r,i})^{0.5}$$

The scaled color difference coordinates for the reference source ($\Delta u'_{N,r,i}$, $\Delta v'_{N,r,i}$) and the lamp to be tested ($\Delta u'_{N,k,i}$, $\Delta v'_{N,k,i}$) can be represented as a, general colour rendering index, graphic in the CIE 1976 $\Delta u'$, $\Delta v'$ colour space, with the chromaticity coordinates of the white point ($u'_{wr}$, $v'_{wr}$) as the origin. An example is provided in FIG. 5.

The advantage of the colour rendering index graphic is that it shows why the general colour rendering index ($R_a$) deviates from a value of 100. It shows the relative colour variations for all eight test-colour samples, both the magnitude and the hue shift. The disadvantage of this graphical representation method is that it does not provide a criterion for the preferred or allowed colour variation. Again, this is expected to be determined by the intended application.

In the present invention, the reference source for determining CRI and the reference source for determining GAI are selected to be the same (see above and see also section 5.2 of CIE13.3-1995 [13]).

Initial user test reveal that slightly increased red saturation is preferred. Instead of or in addition to using gamut area index (which is based on the unsaturated colors used for CRI calculation), the red saturation index can be used. Disadvantage of red over saturation is that it will cost efficiency. Further testing showed that especially (also) increased yellow and/or green saturation (Hue between 90 and 160°) is appreciated. Increasing the gamut area by oversaturating these hue bins can be done with limited efficiency penalty. Based on this insight especially the regions indicated in the FIG. 4 appear to be of especially advantage (see further also below).

The optimal (retail) lighting solution may not only be described by the white and color perception, but also by the system efficiency. There is a trade-off between efficiency (lm/W), white perception (whiteness), and color perception (gamut area index). The highest efficiency solution in LED is an emission spectrum on BBL (Standard CoB), meeting the CRI≥80 and no specific GAI requirement. The Crisp White solution may have a relatively low efficiency: due to the additional deep blue light the overall lumen output per Watt is lower than without the deep blue light. As indicated above, user tests reveal that slight oversaturation of red and/or green/yellow is preferred. Oversaturation, however, of red comes with an efficiency penalty. To meet the energy efficiency demands of Retail lighting, generally at least 105 lm/W on LED level in application is needed. As a consequence, the above suggested solutions may not provide all desired properties, especially for retail lighting.

Hence, it is an aspect of the invention to provide an alternative lighting device, which preferably further at least partly obviates one or more of above-described drawbacks, which especially has a relative high efficiency, a relative high CRI, a high $G_a$ (GAI), a good color rendering and some saturation of one or more colors.

In a first aspect, the invention provides a lighting device comprising an solid state light source configured to provide blue light, especially having a dominant wavelength selected from the range of 440-490 nm, a first luminescent material configured to convert part of the blue light into first luminescent material light having intensity in one or more of the green and yellow having a CIE u', and a second luminescent material configured to convert part of one or more of the blue light and the first luminescent material light into second luminescent material light having intensity in one or more of the orange and red having a CIE u', wherein the first luminescent material and the second luminescent material are selected to provide said first luminescent material light and said second luminescent material light, further especially defined by a maximum ratio of CIE u' and CIE u' being CIE u' (second luminescent material light)=1.58*CIE u' (first luminescent material light)+0.255, and a minimum ratio of CIE u' and CIE u' being CIE u' (second luminescent material light)=2.3*CIE u' (first luminescent material light)+0.04, even more especially u' (second luminescent material light)=2*CIE u' (first luminescent material light)+0.20, and a minimum ratio of CIE u' and CIE u' being CIE u' (second luminescent material light)=2*CIE u' (first luminescent material light)+0.130, and wherein in specific embodiments the lighting device may be configured to provide (at a first setting of the lighting device) white lighting device light having a color temperature of at maximum 3500 K.

Such light emitting device may be used in retail for illuminating merchandise, such as e.g. clothes, electronics, (fresh) food, personal care products, etc. etc. It surprisingly appears that such light source may have a relative high efficiency, a relative high CRI, a relative high GAI, and some saturation of one or more colors. In (consumer) tests, such lighting device was appreciated over prior art solutions and/or the above suggested solutions. The device may also be used for hospitality lighting, such as in a restaurant, a hotel, a clinic, or a hospital, etc., or for other lighting applications (see also below).

The term "CIE u'(211)" is herein also indicated as "CIE u' (first luminescent material light)", and may also be indicated as CIE $u_1'$. The term "CIE u'(221)" is herein also indicated as "CIE u' (second luminescent material light)", and may also be indicated as CIE $u_2'$.

Herein, the terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" refer to light having a wavelength in the range of about 380-780 nm.

As indicated above, the lighting device comprises a solid state light source configured to provide blue light, especially having a dominant wavelength selected from the range of 440-490 nm, even more especially selected from the wavelength range of 440-460 nm, such as 440-455 nm, like especially selected from the wavelength range of 440-450 nm. Smaller or larger dominant wavelengths may lead to spectral light distributions that have a less desired GAI and/or lighting devices that are less efficient.

Especially, the solid state light source is configured to provide a spectral distribution with at least 80% of the power in the spectral region of 380-495 nm in the range of 440-480 nm, and thus especially also with a dominant wavelength in this range of 440-480 nm. The first light source is especially configured to provide blue light having a full width half maximum in the range of up to 100 nm, such as in the range of 5-50 nm. A typical full-width half maximum value of a LED would be in the range of about 15-25 nm, especially in the range of about 15-20 nm. For LED light sources, the dominant wavelength and peak maximum are often substantially identical (for blue LEDs the difference dominant wavelength (DWL) and peak wavelength (PWL) is in the order of 5 nm).

The light source especially comprises a solid state light source, such as a LED or laser diode. The term "light source" may also relate to a plurality of light sources, such as 2-512, like 2-20 solid state light sources. Hence, the term solid state light source may also refer to a plurality of LEDs. Herein, the term "light source" is also applied, an especially refers to "solid state light source". When a plurality of light sources are applied, the light sources may provide light having peak wavelengths (or dominant wavelengths) that are all in the same bin, such as a bin of 5 nm or a bin of 6 nm or a bin of 10 nm. However, optionally two or more bins may be applied.

When different light sources applied, either selected within the same bin or two or more subsets of light sources in e.g. two or more different bins, the light sources or the subsets may be controlled separately. Hence, the lighting device may further comprise a control system configured to control the light source or configured to control a plurality of light sources (see also below).

The light source and the luminescent materials are especially radiationally coupled. The term "radiationally coupled" especially means that the light source and the luminescent material are associated with each other so that at least part of the radiation emitted by the light source is received by the luminescent material (and at least partly converted into luminescence).

When a plurality of light sources is applied, substantially each light source may be radiationally coupled to both luminescent materials. However, in embodiments also a first (subset of) light source(s) may be radiationally coupled with the first luminescent material and a second (subset of) light source(s) may be radiationally coupled with the second luminescent material. Note that even embodiments may be included wherein the light source is only radiationally coupled with the first luminescent material and the second luminescent material is substantially only radiationally coupled with the first luminescent material. This may be the case when the second luminescent material is substantially only excitable by the first luminescent material light, and not by the light source light. In general however, the second luminescent material will also convert part of the light source light.

The term "luminescent material" herein especially relates to inorganic luminescent materials, which are also sometimes indicated as phosphors. These terms are known to the person skilled in the art.

The luminescent materials herein, or especially their luminescent material light, are (is) amongst others identified by CIE u' and v' parameters. The CIE u'v' coordinates refer to the CIE 1976 color space, also known by its abbreviation CIELUV. For example 3000K light (on BBL), characterized by a u',v' color point of 0.251, 0.521 or 0.437, 0.403 in x,y CIE. For the first luminescent materials, i.e. the yellow and/or green luminescent material, as well as for the second luminescent material, i.e. the red (and orange) luminescent material, the v' value are in the range of about 0.52-0.58, especially in the range of about 0.55-0.58 for yellow/green and about 0.52-0.55 for orange/red.

As indicated above, the first luminescent material and the second luminescent material are selected to provide said first luminescent material light and said second luminescent material light especially defined by a maximum ratio of CIE u' and CIE u' being CIE u' (second luminescent material light)=1.58*CIE u' (first luminescent material light)+0.255, and a minimum ratio of CIE u' and CIE u' being CIE u' (second luminescent material light)=2.3*CIE u' (first luminescent material light)+0.04. It appears that when luminescent materials are chosen that comply with these conditions, i.e. have a ratio defined by these equations or have a value between these maximum and minimum ratio's, provide especially the desired optical properties of CIE and GAI, and may provide lighting devices having a good efficiency. Herein, the term "selecting" may include determining from a library of luminescent materials data which luminescent material and which combination of luminescent materials may comply with the desired characteristics such as having the u' coordinates at least in the area defined by the above two equations. This type of selecting luminescent materials is known to a person skilled in the art. The luminescent materials data may include absorption wavelengths, excitation wavelengths, emission wavelengths, color points, CRI, etc. etc. Hence, the "luminescent materials data" especially include optical data in relation to excitation and emission of the luminescent material(s). As indicated below, the term "luminescent material" may also refer to a plurality of luminescent materials. Hence, when a plurality of first luminescent materials is applied the relevant u' value is based on the spectral distribution of the luminescent material of the plurality of first luminescent materials. Likewise, when a plurality of second luminescent materials is applied the relevant u' value is based on the spectral distribution of the luminescent material of the plurality of second luminescent materials (see herein also the examples wherein two second luminescent materials are applied, one a bit more orange, and the other a bit more red).

As indicated above, two specific subareas are of even more interest because of their green/yellow saturation, which are yet even more appreciated by consumers. Hence, in yet further embodiments the first luminescent material and the second luminescent material are selected to provide said first luminescent material light and said second luminescent material light defined by (a) a CIE u' (first luminescent material light) in the range of 0.102-0.12 and a CIE u' (second luminescent material light) in the range of 0.38-0.43, even more especially a CIE u' (first luminescent material light) in the range of 0.102-0.118 and a CIE u' (second luminescent material light) in the range of 0.38-0.415, or by (b) a CIE u' (first luminescent material light) in the range of 0.136-0.164 and a CIE u' (second luminescent material light) in the range of 0.4-0.47, even more especially CIE u' (first luminescent material light) in the range of 0.14-0.158 and a CIE u' (second luminescent material light) in the range of 0.4-0.44.

As indicated above, the lighting device comprises a first luminescent material configured to convert part of the blue light into first luminescent material light having intensity in one or more of the green and yellow having a CIE u'. The first luminescent material may provide also light intensity in other spectral regions upon excitation by the light source. Especially however, the spectral distribution of the first luminescent material light is especially in the green and/or yellow, even more especially in the green. As indicated above, the term "first luminescent material" may also refer to a plurality of different luminescent materials, having different spectral distributions contributing to the first luminescent material light. Especially, the first luminescent material is configured to provide a spectral distribution with at least 80% of the power in the spectral region of 470-650 nm and more specific in the range of 485-630 nm.

Especially, the first luminescent material may comprise $M_3A_5O_{12}:Ce^{3+}$, wherein M is selected from the group consisting of Sc, Y, Tb, Gd, and Lu, wherein A is selected from the group consisting of Al, Ga, Sc and In. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). The term ":Ce" or ":$Ce^{3+}$", indicates that part of the metal ions (i.e. in the garnets: part of the "M" ions) in the luminescent material is replaced by Ce. For instance, assuming $(Y_{1-x}Lu_x)_3Al_5O_{12}$:Ce, part of Y and/or Lu is replaced by Ce. This notation is known to the person skilled in the art. Ce will replace M in general for not more than 10%; in general, the Ce concentration will especially be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art. The term "YAG" especially refers to M=Y and A=Al; the term "LuAG" especially refers to M=Lu and A=Al. In specific embodiments, the first luminescent material comprises $M_3A_5O_{12}$:$Ce^{3+}$, wherein M is selected from the group consisting of Sc, Y, Tb, Gd, and Lu, wherein A is selected from the group consisting of Al, Ga, Sc and In, and wherein at least one or more of (i) M comprises Lu and (ii) A comprises Ga applies. By choosing Lu and/or Ga, the dominant wavelength of the luminescent material light is shifted to shorter wavelengths relative to YAG.

Hence, a specific example of a suitable first luminescent material is a luminescent material having a peak position (i.e. a peak position in the luminescent material light spectral distribution) selected from the range of 510-570 nm, especially 515-560 nm, and having a FWHM selected from the range of 100-150 nm, such as especially 110-140 nm, like about 120 nm. Especially this applies for relatively broad banded green luminescent materials, such as the cerium doped garnets.

Alternatively or additionally, in embodiments the first luminescent material comprises a divalent europium comprising luminescent material, such as a divalent europium comprising silicate or a divalent europium comprising nitride, or a divalent europium comprising oxynitride, or a divalent europium comprising halide, or a divalent europium comprising oxyhalide, or a divalent europium comprising sulfide, or a divalent europium comprising oxysulfide, or a divalent europium comprising thiogallate.

In specific embodiments, the first luminescent material has a peak maximum selected from the range of 510-530 nm and a full width half maximum selected from the range of 60-80 nm. This may especially apply to the more narrow banded green luminescent materials (see also below).

In embodiments, the first luminescent material comprises one or more of $CasMg(SiO_4)_4Cl_2:Eu^{2+}$ and $CasZn(SiO_4)_4Cl_2:Eu^{2+}$ (such as described by S. Okamoto and H. Yamamoto, Electrochemical and solid-state letters, 12, (12) J112-J115 (2009)). In further embodiments, the first luminescent material comprises a β-SiAlON:$Eu^{2+}$ based green emitting phosphor, especially having the formula $Eu_x(A1)_{6-z}(A_2)_zO_yN_{8-z}(A_3)_{2(x+z-y)}$, where $0<z\le4.2$; $0\le y\le z$; $0<x\le0.1$; A1 is Si, C, Ge, and/or Sn; A2 comprises one or more of Al, B, Ga, and In; A3 comprises one or more of F, Cl, Br, and I. The new set of compounds described by $Eu_x(A1)_{6-z}(A2)_zO_yN_{8-z}(A3)_{2(x+z-y)}$ have the same structure as β-$Si_3N_4$. Both elements A1 and A2 reside on Si sites, and both O and N occupy the nitrogen sites of the β-$Si_3N_4$ crystal structure. A molar quantity (z-y) of the A3⁻ anion (defined as a halogen) reside on nitrogen sites. See further e.g.: Synthesis and Photoluminescence Properties of β-sialon:$Eu^{2+}$ ($Si_{6-z}Al_zO_zN_{8-z}:Eu^{2+}$), A Promising Green Oxynitride Phosphor for White Light-Emitting Diodes, R.-J. Xiez, N. Hirosaki, H.-L. Li, Y. Q. Li and M. Mitomo, J. Electrochem. Soc. 2007 volume 154, issue 10, J314-J319.

A specific example of a suitable first luminescent material is a luminescent material having a peak position (i.e. a peak position in the luminescent material light spectral distribution) selected from the range of 510-530 nm, especially 515-525 nm, and having a FWHM selected from the range of 50-90 nm, such as especially 60-80 nm, like about 70 nm. Especially this applies for relatively narrow banded green luminescent materials.

Further, as indicated above the lighting device comprises a second luminescent material configured to convert part of one or more of the blue light and the first luminescent material light into second luminescent material light having intensity in one or more of the orange and red having a CIE u'. The second luminescent material may provide also light intensity in other spectral regions upon excitation by the light source. Especially however, the spectral distribution of the second luminescent material light is especially in the orange and/or red, even more especially in the red. As indicated above, the term "second luminescent material" may also refer to a plurality of different luminescent materials, having different spectral distributions contributing to the second luminescent material light. Especially, the second luminescent material is configured to provide a spectral distribution with at least 80% of the power in the spectral region of 570-760 nm in the range of 585-720 nm.

In embodiments, the second luminescent material may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by Eu$^{2+}$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba.

The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca).

Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

In specific embodiments, the second luminescent material comprises MAlSiN$_3$:Eu, wherein M is one or more elements selected from the group consisting of barium (Ba), strontium (Sr) and calcium (Ca), especially one or more of Sr and Ca. In an embodiment, the second luminescent material comprises CaAlSiN$_3$:Eu ("eCAS") and in another embodiment, the second luminescent material comprises SrAlSiN$_3$:Eu (eSCAS). The latter is blue shifted by up to about 30 nm relative to the former. Especially, these type of luminescent materials may provide the desired optical properties together with the first luminescent materials and the light source. In further specific embodiments, the second luminescent material comprises different MAlSiN$_3$:Eu compounds, with a first compound with M at least comprising Ca and a second compound with M at least comprising Sr. Hence, in such first compound M may predominantly, such as at least 50%, even more especially at least 90%, comprise Ca, and in such second compound M may predominantly, such as at least 50%, even more especially at least 90%, comprise Sr. Part of M is replaced by Eu, such as about 0.1-4%.

A specific example of a suitable second luminescent material is a luminescent material having a peak position (i.e. a peak position in the luminescent material light spectral distribution) selected from the range of 610-680 nm, especially 616-650 nm, and having a FWHM selected from the range of 60-150 nm, such as especially 60-130 nm, like about 80-120 nm.

In specific embodiments, the second luminescent material comprises a first second luminescent material having a first second peak maximum selected from the range of 610-640 and a full width half maximum selected from the range of 60-110 nm and a second second luminescent material having a second second luminescent material peak maximum selected from the range of 630-680 nm and having a full width half maximum selected from the range of 60-130 nm, and wherein the first second peak maximum and the second second peak maximum differ with at least 10 nm, such as in the range of 15-40 nm. The first second luminescent material may be slightly more orange than the second second luminescent material, and the second second luminescent material may (thus) be slightly redder than the first second luminescent material.

The luminescent material(s) may be provided as such, such as a coating of the luminescent material predominantly or even entirely consisting of the luminescent material(s), or may be embedded in a matrix, such as a silicone matrix or a PMMA matrix. Combinations of these embodiments may also be possible. The different luminescent materials may be provided in different ways, and may e.g. be provided in different matrix layers or in different matrices.

In specific embodiments, the solid state light source has a LED die, wherein the lighting device comprises a light converter comprising said first luminescent material and said second luminescent material, and wherein the light converter is in physical contact with the LED die. Note that optionally the light converter may only comprise one of the luminescent materials. Further, the term "light converter" may also refer to a plurality of (different) light converters. Yet further, when a plurality of light sources are applied, one or more light sources may radiationally coupled to one or more light converters including substantially only the first luminescent material and one or more light sources may radiationally coupled to one or more light converters including substantially only the second luminescent material. The light converter may comprise a garnet material, or a polymer material, like a resin, or PMMA or siloxane polymer, etc. The light converter is transmissive for the light source light and the luminescent material light. In yet further embodiments, which may be combined with one or more of the preceding embodiments, the light converter is not in physical contact with the light source, but is configured at some distance from the LED die, such as 0.5-100 mm from the LED die.

The lighting device is especially configured to provide white light (at a first setting). Hence, especially the lighting device is configured to provide at said first setting of the lighting device white lighting device light. The phrase "at a first setting of the lighting device" indicates that the lighting device at least includes a single setting such as "on". Hence, the invention also provides lighting devices which have (substantially) no tunability in intensity except for "on" and "off". A plurality of settings may especially be available when there is more than one light source. When a plurality of setting is possible, at least one setting may provide white light. Other settings may provide white light with a different color temperature or colored light, etc.

The term "white light" herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even in some embodiments within about 5 SDCM from the BBL.

Hence, a plurality of settings may especially be provided when the lighting device further comprises a control system, configured to control the lighting device light (by controlling the light source(s). Therefore, in yet a further embodiment the light emitting device may further comprise a control system configured to control the power provided to the (one or more) (solid state) light sources. Alternatively or additionally, the control system may be (configured) external from the light emitting device. Optionally, the control system may comprise a plurality of elements, of which some may be comprised by the light emitting device and others may be external from the light emitting device (such as a remote user interface, see also below). The light emitting device may e.g. be integrated in a lighting system with a plurality of light emitting devices and optional other type of light emitting devices than described herein.

In yet a further specific embodiment, the control system is configured to control the power provided to the one or more (solid state) light sources as function of an input signal of a user interface. This user interface may be integrated in the light emitting device, but may also be remote from the light emitting device. Hence, the user interface may in embodiments be integrated in the light emitting device but may in other embodiments be separate from the light emitting device. The user interface may e.g. be a graphical user interface. Further, the user interface may be provided by an App for a Smartphone or other type of android device. Therefore, the invention also provides a computer program product, optionally implemented on a record carrier (storage medium), which when run on a computer executes the method as described herein (see below) and/or can control (the color temperature of the light emitting device light of) the light emitting device as described herein (as function of the power provided to the one or more (solid state) light sources).

Alternatively or additionally, the control system is configured to control the power provided to the one or more (solid state) light sources as function of one or more of a sensor signal and a timer. To this end, e.g. a timer and/or a sensor may be used. For instance, the timer may be used to switch off after a predetermined time. Further, for instance the sensor may be a motion sensor, configured to sense motion, with the control system configured to switch on the light emitting device when the motion sensor senses motion or presence of e.g. a person. Further, the sensor may be an optical sensor, e.g. to sense the light, especially the light emitting device light, reflected by a product (illuminated with the light emitting device light).

Hence, in a further aspect the invention also provides a lighting system comprising the light emitting device as defined herein and a control system configured to control the light emitting device. As indicated above, the control system may also be comprised by the lighting device. The lighting system may especially comprise a control system configured to control the lighting device and one or more other devices, such as a plurality of the lighting devices as described herein and optionally also other lighting devices. The control system may control the lighting device(s) as function of one or more of a sensor signal and a timer (see also above).

As indicated above, desired color temperatures are at maximum 3500 K. Hence, especially the color temperature is selected from the range of 2000-3500 K, even more especially 2500-3500 K. Further, especially the color point (CIE u'v' 1976) is especially below the BBL. Hence, in yet further embodiments the lighting device is configured to provide at a first setting of the lighting device white lighting device light having a color temperature of at maximum 3500 K, and having a CIE v' of at least 0.005, such as at least 0.008 below the black body locus (BBL). Even more especially, the lighting device is configured to provide at said first setting of the lighting device white lighting device light having a CIE v' of at maximum 0.02, especially at maximum 0.015, below the black body locus (BBL). As indicated above, the person skilled in the art knows how to select luminescent materials from a library with luminescent materials data to provide the desired optical properties.

In yet further embodiments, the lighting device is configured to provide at said first setting of the lighting device white lighting device light having a color rendering index (CRI) of at least 80, especially at least 90. Hence, especially the light source and the luminescent materials are selected that are capable in providing (at the first setting) such CRI of the lighting device light.

In further embodiments, the lighting device is configured to provide at said first setting of the lighting device white lighting device light having a gamut area index (GAI) of at least 80, even more especially at least 90, yet even more especially at least 100, such as in the range of 101-120. Hence, especially the light source and the luminescent materials are selected that are capable in providing (at the first setting) such GAI.

In a specific embodiment of the light emitting device, the solid state light source, the first luminescent material and the second luminescent material are configured to provide a spectral distribution with at least 80% of the power in the spectral region of 380-495 nm in the range of 440-480 nm, at least 80% of the power in the spectral region of 470-650 nm in the range of 485-630 nm, and at least 80% of the power in the spectral region of 570-760 nm in the range of 585-720 nm. Yet even more especially, the solid state light source, the first luminescent material and the second luminescent material are configured to provide a spectral distribution with a first maximum selected from the range of 440-450 nm with a full width half maximum selected from the range of 15-30 nm (i.e. especially provided by the light source), and a band comprising at least two maxima with a second maximum selected from the range of 515-545 nm (due to the first luminescent material) and a third maximum selected from the range of 610-630 nm (due to the second luminescent material), wherein the band has an intensity of at least 40% (Watt) of the first maximum over the entire wavelength range of 500-680 nm. The luminescence band is provided by the luminescence of the first luminescent material and the second luminescent material. In other words, the height in the luminescence spectrum of such light emitting device has a first maximum at 440-450 nm, and over the entire wavelength range of 500-680 nm, the spectral intensity is at least as high as 50% of the peak maximum at 440-450 nm.

Hence, in specific embodiments the solid state light source is configured to provide blue light having a dominant wavelength selected from the range of 440-470 nm, wherein the first luminescent material has a peak maximum selected from the range of 510-530 nm and a full width half maximum selected from the range of 60-80 nm, and wherein the second luminescent material comprises a first second luminescent material having a first second peak maximum selected from the range of 610-640 and a full width half maximum selected from the range of 60-110 nm and a second second luminescent material having a second second luminescent material peak maximum selected from the range of 630-680 nm and having a full width half maximum selected from the range of 60-130 nm, and wherein the first second peak maximum and the second second peak maximum differ with at least 10 nm.

In yet a further embodiment, the solid state light source is configured to provide blue light having a dominant wavelength selected from the range of 440-470 nm, wherein the first luminescent material has a peak maximum selected from the range of 510-560 nm and a full width half maximum selected from the range of 90-150 nm, and wherein the second luminescent material comprises a first second luminescent material having a first second peak maximum selected from the range of 610-640 and a full width half maximum selected from the range of 60-110 nm and a second second luminescent material having a second second luminescent material peak maximum selected from the range of 630-680 nm and having a full width half maximum selected from the range of 60-130 nm, and wherein the first second peak maximum and the second second peak maximum differ with at least 10 nm.

Yet even more especially, the solid state light source is configured to provide blue light having a dominant wavelength selected from the range of 445-465 nm, wherein the first luminescent material comprise $Lu_3Al_5O_{12}$:Ce, and wherein the second luminescent material comprises $CaAlSiN_3$:Eu. Yet more especially, the solid state light source is configured to provide blue light having a dominant wavelength selected from the range of 445-465 nm, wherein the first luminescent material comprise $Lu_3Al_5O_{12}$:Ce, and wherein the second luminescent material comprises $CaAlSiN_3$:Eu and $SrAlSiN_3$:Eu.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

The lighting device may be used in hospitality lighting, retail lighting, etc. Further, the lighting device may be configured as retrofit lamp. Further, the lighting device may include optics. For instance, in embodiments the lighting device is configured as parabolic aluminized reflector (PAR) lamp.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1A:
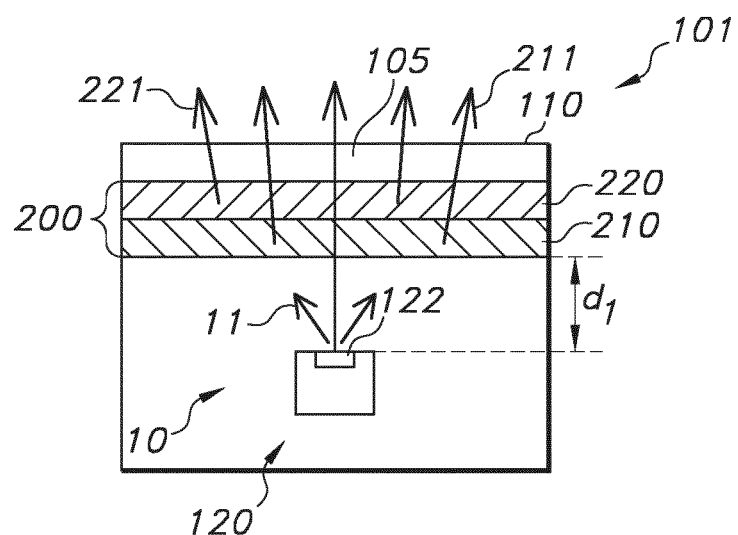
FIGS. 1a-1c schematically depict some aspects of the invention.

FIG. 1a schematically depicts an embodiment of a lighting device 100 as described herein. The lighting device 100 comprises a light source 10 configured to provide blue light source light 11, a first luminescent material 210 configured to convert at least part of the light source light 11 into first luminescent material light 211 with light intensity in one or more of the green spectral region and yellow spectral region and a second luminescent material 220 configured to convert (i) at least part of the light source light 11, or (ii) at least part of the light source light 11 and at least part of the first luminescent material light 211 into second luminescent material light 221 with light intensity in the orange and/or red spectral region.

Further, the lighting device comprises a light exit face 110. Herein in the embodiment of FIG. 1a, this may be the downstream face of a window 105.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

Figure 1B:
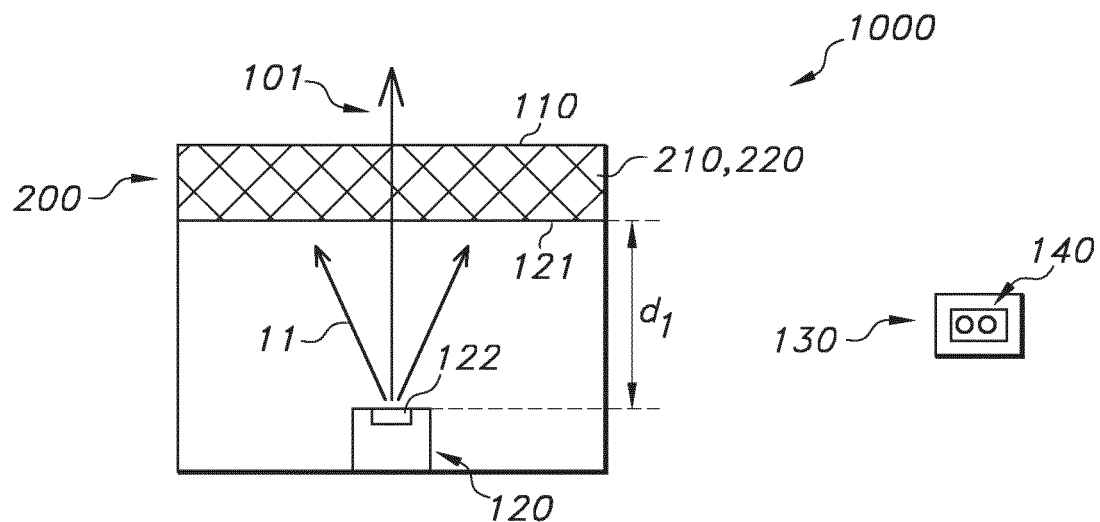
Figure 1C:
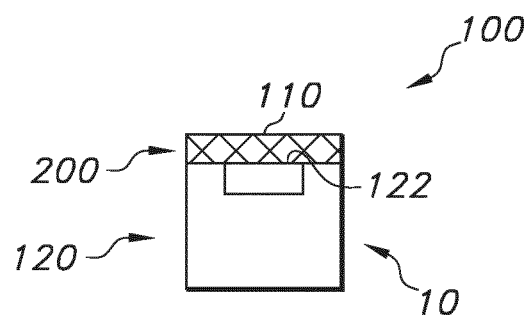

In FIG. 1b this is the downstream face of a converter 200. Here, in FIGS. 1a-1c the converter 200 comprises the first luminescent material 210 and the second luminescent material 220, e.g. a layers (FIG. 1a), or as mixture (FIGS. 1b-1c). Note that the converter 200 may also include materials and/or layers other than the first luminescent material 210 and the second luminescent material 220. In FIG. 1a, the converter is configured upstream of the light exit face, here upstream of window 105. Especially, when using separate layers of the first luminescent material 210 and the second luminescent material 220, the latter is configured downstream of the former, in order to further facilitate absorption of the first luminescent material light 211. Would the second luminescent material 220 substantially not absorb first luminescent material light 211, then the order of the layers may also be revered. Further, also mixtures may be applied (see FIGS. 1b-1c).

Further, the lighting device 100 is configured to provide lighting device light 101 downstream from said light exit face 110. Here, as shown in FIG. 1a, the lighting device light 101 comprises one or more of said light source light 11, said first luminescent material light 211, and said second luminescent material light 221. As indicated above, the second luminescent material 220 is configured to be at least partly saturated with (i) light source light 11, or (ii) light source light 11 and first luminescent material light 211.

The distance between the first and/or the second luminescent materials and the light source 10, especially the light emitting surface, is indicated with reference d1, which is (substantially) zero in the case of FIG. 1c (d1 not depicted in FIG. 1c) and which may be in the range of 0.1-50 mm, especially 1-20 mm in e.g. the embodiment of FIGS. 1a-1b. In the schematically depicted embodiment, the distance d1 is the distance between a light exit surface (or light emitting surface) 122 of a solid state light source 120, such as an LED die.

FIG. 1b schematically further depicts a control system 130, which may include a user interface 140. Hence, FIG. 1b also schematically depicts a lighting system 1000.

The lighting device 100 may especially be applied for providing white lighting device light 101.

In this invention we describe the solution of a source that has the best compromise between the three parameters. The starting point is the white light source that does not have deep blue. The color perception can be improved by increasing the color gamut to above 100 for both CRI80 and CRI90 solutions. If within the efficiency limit, the color point of the white light could be brought even slightly more below BBL than the initial color point x,y=(0.422, 0.386) (i.e.: u',v': 0.249, 0.512. Further, within efficiency limits the GAI of the premium white could be increased to enhance saturation of red.

In an embodiment, an optimal retail lighting source is described by: >105 lm/W LED efficiency in the application (DC operated at Tj=~85° C. (junction temperature); a color point target below BBL x,y=(0.422, 0.386); and a GAI≥100.

Figure 2:
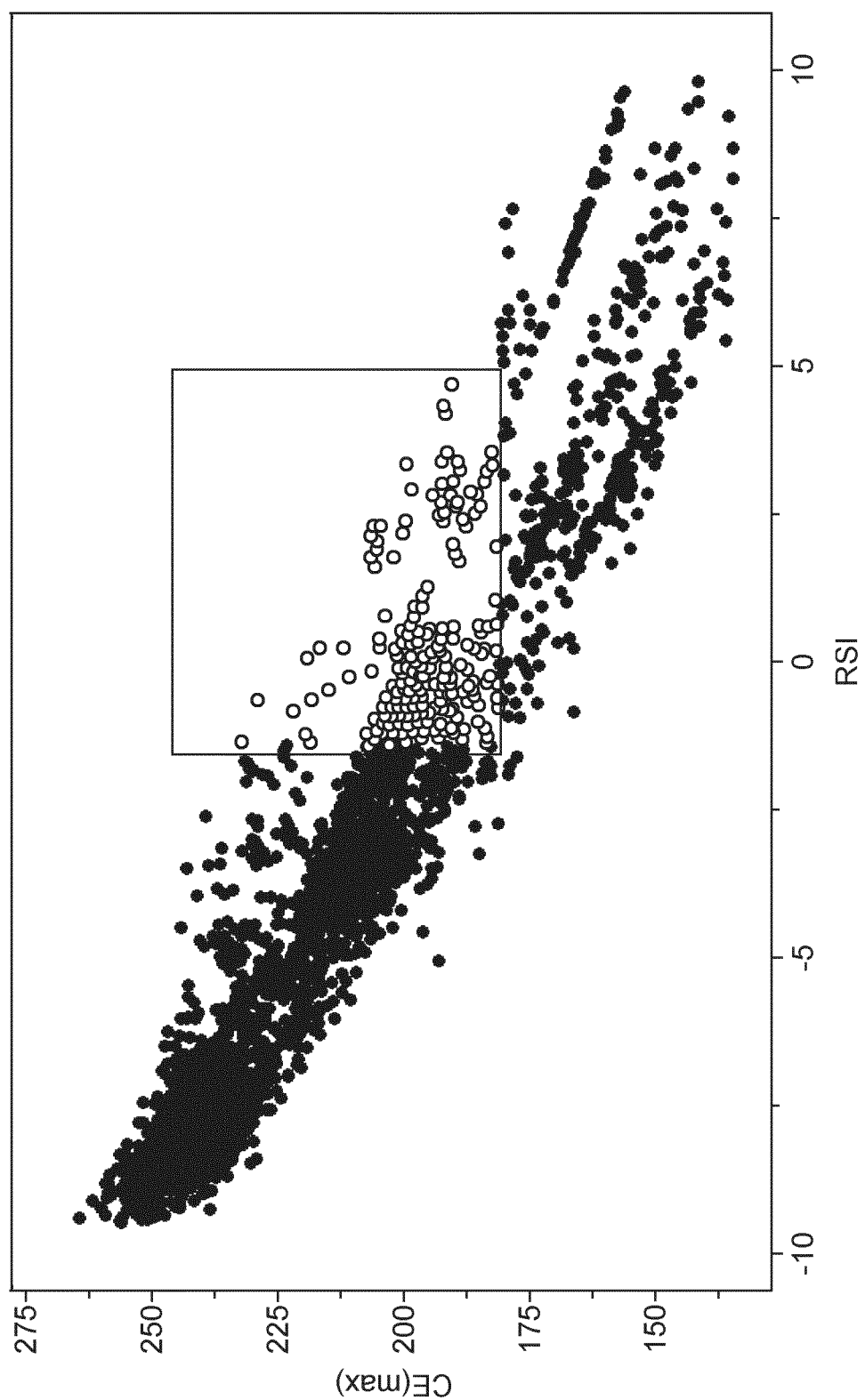
FIG. 2 shows a scatter plot of CE(max) (y-axis) versus Red saturation index (RSI)(x-axis): a plurality of light source and luminescent material combinations with the area of RedSatIdx>−2 at sufficient high overall efficiency, indicated with the rectangle.

To achieve GAI≥100, a phosphor emission spectrum is needed which has more pronounced spectral peaks than the mainstream phosphors used for white. Specific embodiments have a Red Saturation Index (RedSatIdx)>−2 and a as high as possible CE(max) (with CE being conversion efficiency (Lm/Watt: lumen lamp/watt provided to lamp). Based on this criteria we selected the datapoints as given in FIG. 2, indicated in the box.

Figure 3:
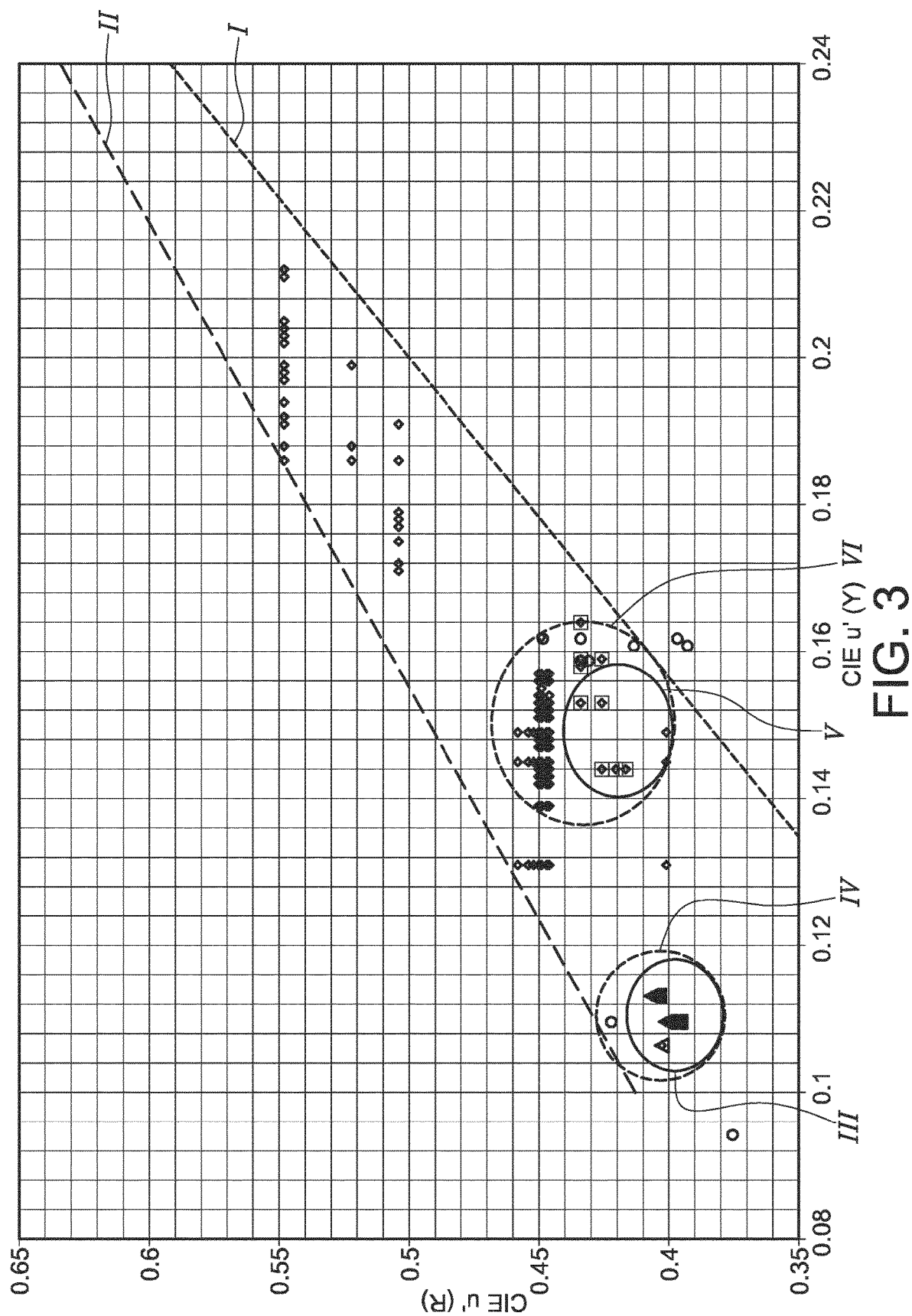
FIG. 3 shows a scatterplot of CIE u' (red) (y-axis) versus CIE u' (yellow/green)(x-axis): color point of both red and green/yellow phosphors that fulfill the Red saturation and efficiency requirement for the invented white light source; when the above indicated equations are complied with, the desired optical properties, including GAI may be obtained; each point indicates a combination of luminescence of a first and a second luminescent material.

FIG. 3 shows a scatterplot of CIE u' (red) (y-axis) versus CIE u' (yellow/green)(x-axis): color point of both red and green/yellow phosphors that fulfill the GAI and efficiency requirement for the invented white light source; when the above indicated equations are complied with, the desired optical properties, including $G_a$ may be obtained. Line II reflects the equation CIE u'(221)=1.58*CIE u'(211)+0.255 and line I reflects the equation CIE u'(221)=2.3*CIE u'(211)+0.04. Within these lines, luminescent material combinations of (a) green and/or yellow and (b) orange and/or red provide the desired optical properties (in combination with the light source) of one or more of CRI, efficiency, GAI, etc.

Further, it appears that two specific sub regions provide especially good results. These sub regions are indicated with the areas IV and VI, even more especially the sub regions III and V (which latter are the smaller regions within the former regions). For first luminescent materials that are more greenish, the left regions III,IV are especially of relevance, whereas for the more yellowish first luminescent materials, the right regions V, VI are especially of relevance. Especially these regions provide relative good $G_a$ values, such as in the range of >100, up to about 115.

Figure 4:
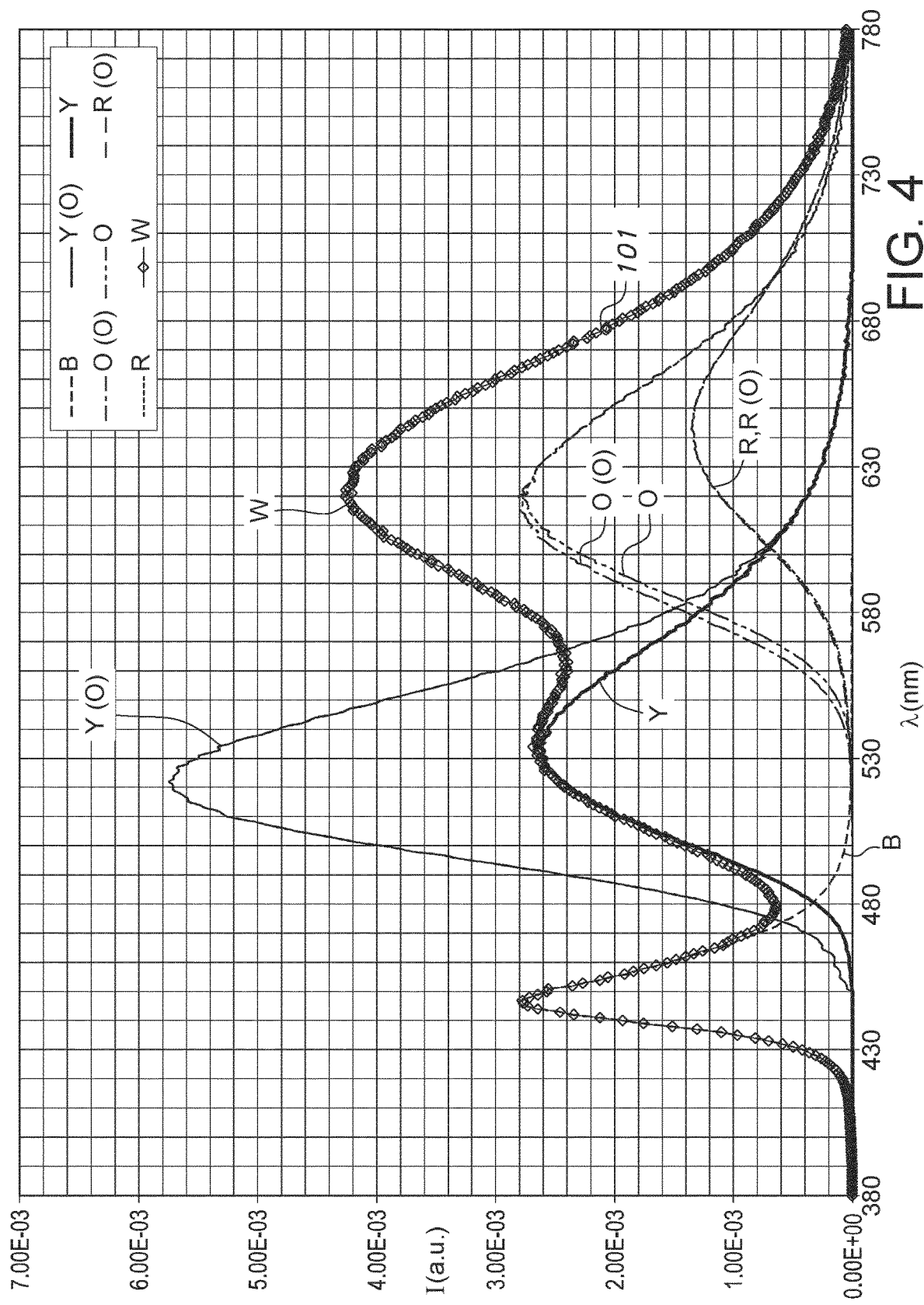
FIG. 4 shows an embodiment of a suitable spectral distribution of the device light, with on the x-axis the wavelength (nm) and on the y-axis intensity (measured on energy scale (Watt))

FIG. 4 shows an embodiment of a suitable spectral distribution of the device light 101 (also indicated with "W" as it is white light), with on the x-axis the wavelength (nm) and on the y-axis intensity (in W). Reference B indicates the blue spectral distribution, Y(O) indicates the spectral distribution of the yellow luminescent material (without reabsorption by the red phosphor(s)) and Y indicates the spectral distribution of the yellow/green luminescent material in the total spectral distribution of the white light W. Likewise, references R(O) and R indicate the spectral distribution of the red luminescent material and of the red luminescent material in the total spectral distribution W. Likewise, references O(O) and O indicate the spectral distribution of the orange luminescent material and of orange red luminescent material in the total spectral distribution W. Note that the orange luminescent material is also a red luminescent material, but with relative more spectral intensity also in the orange spectral part (peak wavelength in the 600-630 nm range). FIG. 4 shows a spectral distribution with a first maximum (at $2.8 \cdot 10^{-3}$) selected from the range of 440-450 nm with a full width half maximum selected from the range of 15-30 nm, and a band comprising at least two maxima with a second maximum selected from the range of 515-545 nm and a third maximum selected from the range of 610-630 nm, wherein the band has an intensity of at least 40% of the first maximum (i.e. at least 0.4* at $2.8 \cdot 10^{-3}$) over the wavelength range of 500-680 nm.

Figure 5:
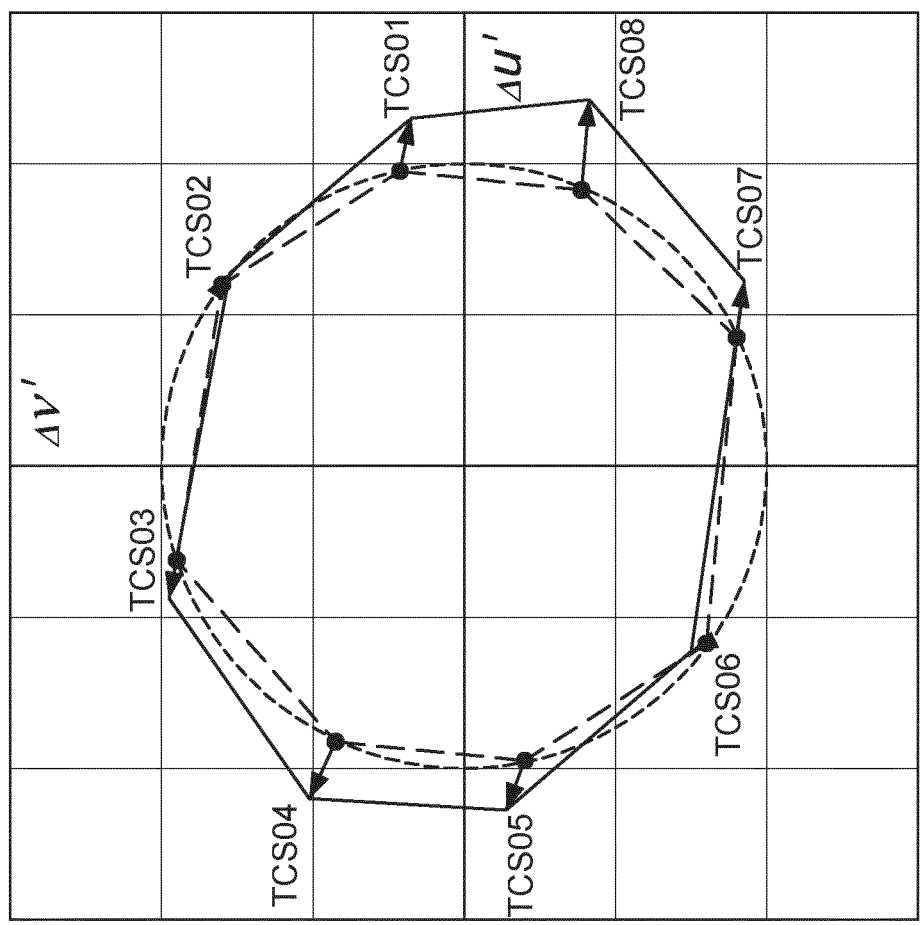
FIG. 5: example of a general colour rendering index graphic for a test light source, which was used in the study by Jost et al. The graphic shows the changes in colorfulness and hue shifts for the eight CIE1974 test-colour samples (defined in CIE publication 13.3-1995). The dashed circle indicates a distance of unity to the origin, whereas the solid line, connecting the points for the test light source, indicates the relative increase in gamut area. The arrows in the graphic represent the change in colorfulness and hue for the eight test-colour samples, relative to the reference illuminant.

FIG. 5 shows an example of a general colour rendering index graphic for test light source, which was used in the study by Jost et al. The graphic shows the changes in colorfulness and hue shifts for the eight CIE1974 test-colour samples (defined in CIE publication 13.3-1995). The dashed circle indicates a distance of unity to the origin, whereas the solid line, connecting the points for the test light source, indicates the relative increase in gamut area. The arrows in the graphic represent the change in colorfulness and hue for the eight test-colour samples, relative to the reference illuminant.

Below, some further examples are given, with a 448 nm blue LED in combination with a narrow green phosphor (PWL) indicated in the last column) and a mixture of 2 red phosphors ($SrAlSiN_3$:Eu ("orange") and $CaAlSiN_3$:Eu ("red")), which all give the desired spectral properties (such as CRI over 90 and GAI over 100).

TABLE 1 combinations with narrow banded green/yellow

| CRI | R9 | Ga | CIE u (yellow) | CIE u (red) | Blue (%) | Green (%) | Orange (%) | Red (%) | pwL green |
|---|---|---|---|---|---|---|---|---|---|
| 92.5 | 58.7 | 105 | 0.1096 | 0.3956 | 0.127 | 0.335 | 0.479 | 0.060 | 522 |
| 92.6 | 59.8 | 105 | 0.1096 | 0.3959 | 0.126 | 0.335 | 0.473 | 0.066 | 522 |
| 92.8 | 61.1 | 105 | 0.1096 | 0.3962 | 0.126 | 0.334 | 0.467 | 0.073 | 522 |
| 93.0 | 62.7 | 105 | 0.1096 | 0.3967 | 0.126 | 0.334 | 0.459 | 0.081 | 522 |
| 93.3 | 64.7 | 106 | 0.1096 | 0.3973 | 0.125 | 0.333 | 0.449 | 0.093 | 522 |
| 93.7 | 67.4 | 106 | 0.1096 | 0.3980 | 0.124 | 0.332 | 0.436 | 0.108 | 522 |
| 94.1 | 71.2 | 106 | 0.1096 | 0.3991 | 0.123 | 0.331 | 0.418 | 0.128 | 522 |
| 94.3 | 73.1 | 107 | 0.1096 | 0.3997 | 0.123 | 0.330 | 0.408 | 0.139 | 522 |
| 94.5 | 75.3 | 107 | 0.1096 | 0.4004 | 0.122 | 0.330 | 0.397 | 0.151 | 522 |
| 94.6 | 78.0 | 107 | 0.1096 | 0.4012 | 0.121 | 0.329 | 0.383 | 0.166 | 522 |
| 94.1 | 80.6 | 108 | 0.1131 | 0.4037 | 0.122 | 0.329 | 0.342 | 0.207 | 524 |
| 94.2 | 83.0 | 108 | 0.1131 | 0.4045 | 0.121 | 0.329 | 0.329 | 0.221 | 524 |
| 94.2 | 85.8 | 108 | 0.1131 | 0.4055 | 0.120 | 0.328 | 0.315 | 0.237 | 524 |
| 94.2 | 89.0 | 109 | 0.1131 | 0.4067 | 0.119 | 0.327 | 0.298 | 0.255 | 524 |

Hence, amongst others the invention provides a light source for providing blue light, a first luminescent material for providing first luminescent material light and a second luminescent material for providing second luminescent material, which are configured to provide white lighting device light (at a first setting) having spectral distributions (Watt) in the range of 11-14%, especially 11.9-12.7% for the blue light, 31-35%, especially 32.7-33.5% for the first luminescent material light, and 52-57%, especially 53.9-55.3%, for the second luminescent material light. Even more especially, the invention provides the light source for providing blue light, the first luminescent material for providing first luminescent material light and the second luminescent material for providing second luminescent material, wherein the second luminescent material comprises a first second luminescent material for providing first second luminescent material light, and a second second luminescent material for providing second second luminescent material light, which are configured to provide white lighting device light (at a first setting) having spectral distributions (Watt) in the range of 11-14%, especially 11.9-12.7% for the blue light, 31-35%, especially 32.7-33.5% for the first luminescent material light, and 28-50%, especially 29.8-47.9% for first second luminescent material light and 5-27%, especially 6-25.5%, for the second second luminescent material light. Especially, this applies to first luminescent materials having a relatively narrow band width, such as in the range of 60-90 nm.

FIG. 4 relates to one of the combinations shown in the above table 1.

First luminescent materials that are garnet based, may provide broader spectral distribution of the first luminescent material light, such as in the range of 110-140 nm. Examples are given, with a 448 nm blue LED in combination with a broader green (yellow) and a mixture of 2 red phosphors (SrAlSiN$_3$:Eu ("orange") and CaAlSiN$_3$:Eu ("red")), which all give the desired spectral properties (such as CRI over 90 and GAI over 100).

TABLE 2 combinations with broad banded green/yellow CRI

| Ga | R9 | CIE u (yellow) | CIE u (red) | Green phosphor | Blue (%) | Green (%) | Orange (%) | Red (%) |
|---|---|---|---|---|---|---|---|---|
| 94 | 103 | 74 | 0.144 | 0.4166 | LuAG | 0.118 | 0.415 | 0.146 | 0.320 |
| 95 | 104 | 80 | 0.144 | 0.4204 | LuAG | 0.116 | 0.413 | 0.111 | 0.360 |
| 96 | 105 | 89 | 0.144 | 0.4258 | LuAG | 0.114 | 0.410 | 0.064 | 0.412 |
| 94 | 104 | 75 | 0.153 | 0.4258 | Y(Al,Ga)G | 0.118 | 0.434 | 0.059 | 0.389 |
| 93 | 104 | 72 | 0.159 | 0.4258 | Y(Al,Ga)G | 0.118 | 0.456 | 0.055 | 0.370 |
| 93 | 104 | 72 | 0.159 | 0.4258 | Y(Al,Ga)G | 0.118 | 0.456 | 0.055 | 0.370 |
| 95 | 105 | 85 | 0.153 | 0.4339 | Y(Al,Ga)G | 0.114 | 0.426 | 0 | 0.460 |
| 94 | 105 | 80 | 0.158 | 0.4339 | Y(Al,Ga)G | 0.115 | 0.452 | 0 | 0.432 |
| 93 | 105 | 78 | 0.164 | 0.4339 | Y(Al,Ga)G | 0.122 | 0.458 | 0 | 0.421 |
| 93 | 106 | 81 | 0.162 | 0.4339 | LuAG | 0.119 | 0.459 | 0 | 0.422 |

Hence, amongst others the invention provides a light source for providing blue light, a first luminescent material for providing first luminescent material light and a second luminescent material for providing second luminescent material, which are configured to provide white lighting device light (at a first setting) having spectral distributions (Watt) in the range of 11-13%, especially 11.4-12.2% for the blue light, 40-47%, especially 41-45.9% for the first luminescent material light, and 41-49%, especially 42.1-47.6% for the second luminescent material light. Even more especially, the invention provides the light source for providing blue light, the first luminescent material for providing first luminescent material light and the second luminescent material for providing second luminescent material, wherein the second luminescent material comprises a first second luminescent material for providing first second luminescent material light, and a second second luminescent material for providing second second luminescent material light, which are configured to provide white lighting device light (at a first setting) having spectral distributions (Watt) in the range of 11-13%, especially 11.4-12.2% for the blue light, 40-47%, especially 41-45.9% for the first luminescent material light, and 0-16%, especially 0-14.6% for first second luminescent material light and 30-48%, especially 32-46%, for the second second luminescent material light.

Percentages of the spectral distribution (in the visible) add up to 100%.

Figure 6:
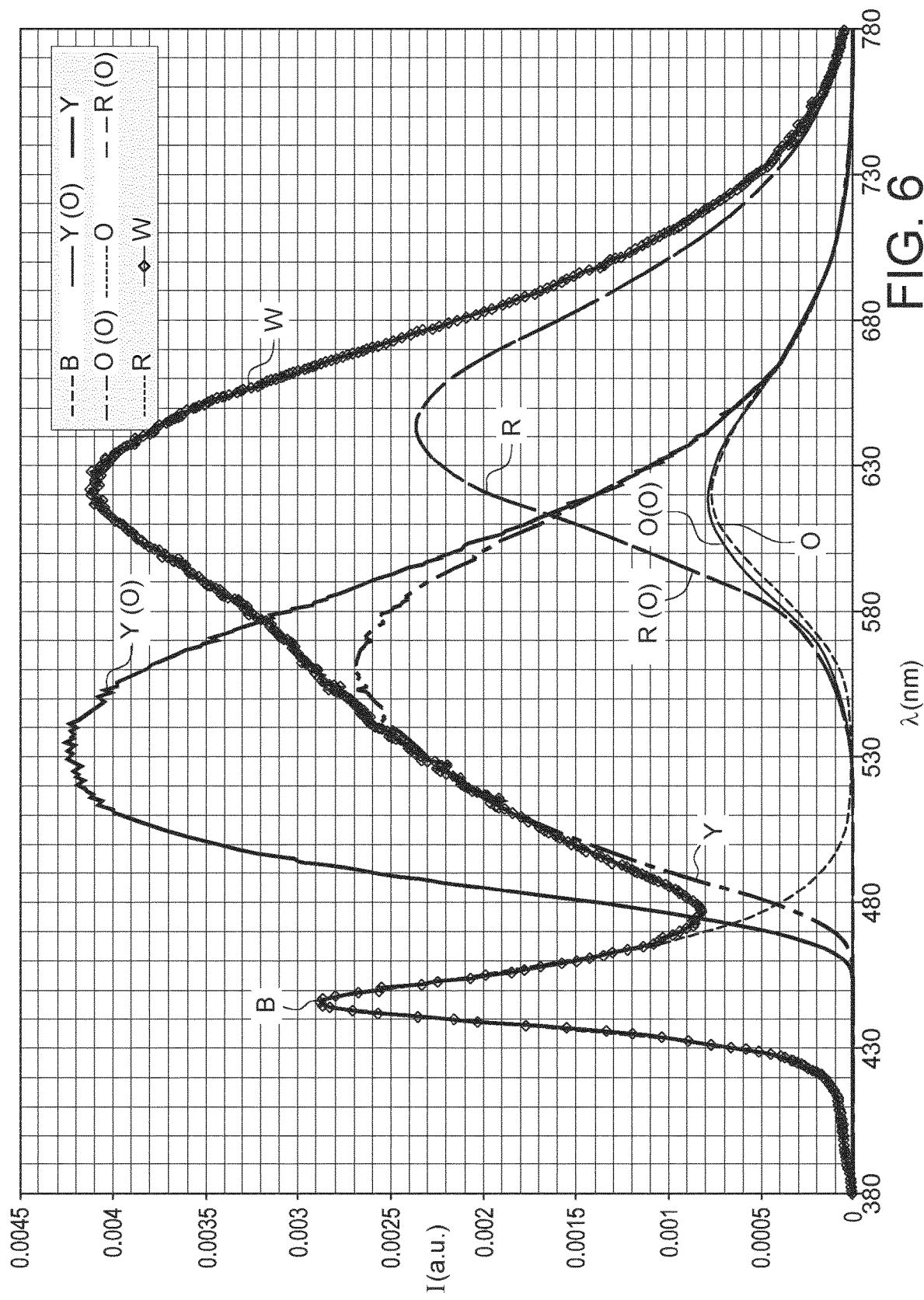
FIG. 6 shows an embodiment of a suitable spectral distribution of the device light, with on the x-axis the wavelength (nm) and on the y-axis intensity (measured on energy scale (Watt)).

FIG. 6 shows an embodiment of a suitable spectral distribution of the device light 101 (also indicated with "W" as it is white light), with on the x-axis the wavelength (nm) and on the y-axis intensity (in W). Reference B indicates the blue spectral distribution, Y(O) indicates the spectral distribution of the yellow luminescent material (without reabsorption by the red phosphor(s)) and Y indicates the spectral distribution of the yellow/green luminescent material in the total spectral distribution of the white light W. Likewise, references R(O) and R indicate the spectral distribution of the red luminescent material and of the red luminescent material in the total spectral distribution W. Likewise, references O(O) and O indicate the spectral distribution of the orange luminescent material and of orange red luminescent material in the total spectral distribution W. Note that the orange luminescent material is also a red luminescent material, but with relative more spectral intensity also in the orange spectral part (peak wavelength in the 600-630 nm range). FIG. 6 shows a spectral distribution with a first maximum (at 0.0029) selected from the range of 440-450 nm with a full width half maximum selected from the range of 15-30 nm, and a band comprising at least two maxima with a second maximum selected from the range of 510-570 nm and a third maximum selected from the range of 610-630 nm, wherein the band has an intensity of at least 40% of the first maximum (i.e. at least 0.4* at 0.0029) over the wavelength range of 500-680 nm. Note that due to reabsorption, the contribution of the first luminescent materials to the white curve W is slightly different from the original first luminescent material light spectra distribution Y(O). Further, note that the second maximum is only visible as a shoulder. Note however that the white curve, between about 480 and 780 nm consists of two contributions: the first luminescent material light and the second luminescent material light, wherein in this embodiment the latter consists also of two contributions.

FIG. 6 relates to one of the combinations shown in the above table 2.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications. Below, some references in relation to the gamut area index (GAI or Ga) are provided, which references are herein incorporated by reference.

REFERENCES FOR $G_a$

[1] American National Standards Institution, American National Standard for electric lamps-Specification for the Chromaticity of Fluorescent Lamps, ANSI C78.376-2001
[2] American National Standards Institution, American National Standard for electric lamps-Specifications for the Chromaticity of Solid State Lighting Products, ANSI C78.377: 2011.
[3] CEI/IEC 60081:1997+A1:2000. Double-capped fluorescent lamps—Performance specifications.
[4] IEC 62612:2013. Self-ballasted LED lamps for general lighting services with supply voltages >50V—Performance requirements.
[5] IEC 62717:2014. LED modules for general lighting—Performance requirements
[6] IEC 62722-2-1:2014. Luminaire performance—Part 2-1: Particular requirements for LED luminaires.
[7] ISO 8995:2002(E)/CIE S 008/E-2001, Lighting of indoor work places
[8] Commission regulation (EC) No 244/2009, Implementing Directive 2005/32/EC of the European Parliament and of the Council with regard to ecodesign requirements for non-directional household lamps.

[9] Commission regulation (EC) No 245/2009. Implementing Directive 2005/32/EC of the European Parliament and of the Council with regard to ecodesign requirements for fluorescent lamps without integrated ballast, for high intensity discharge lamps, and for ballasts and luminaires able to operate such lamps, and repealing Directive 2000/55/EC of the European Parliament and of the Council.

[10] Commission regulation (EU) No 347/2010. Amending Commission Regulation (EC) No 245/2009 as regards the ecodesign requirements for fluorescent lamps without integrated ballast, for high intensity discharge lamps, and for ballasts and luminaires able to operate such lamps.

[11] Commission regulation (EU) No 1194/2012. Implementing Directive 2009/125/EC of the European Parliament and of the Council with regard to ecodesign requirements for directional lamps, light emitting diode lamps and related equipment.

[12] ENERGY STAR®. Program Requirements Product Specification for Lamps (Light Bulbs)—Eligibility Criteria, Version 1.1, 2014.

[13] Commission Internationale de l'Eclairage, Method of Measuring and Specifying Colour Rendering Properties of Light Sources. CIE Publication 13.3, Vienna: CIE 13.3, 1995.

[14] Teunissen C, et al., final paper title under discussion, accepted for publication in Lighting Research & Technology.

[15] Ohno Y, Fein M, Miller C. Vision experiment on chroma saturation for color quality preference. In: Proceedings of the 28th CIE session 2015; CIE 216:2015, Volume 1, Part 1; pp. 60-69. Manchester, United Kingdom, Jun. 28-Jul. 4, 2015.

The invention claimed is:

1. A lighting device comprising:
a solid state light source configured to provide blue light having a dominant wavelength selected from the range of 440-490 nm,
a first luminescent material configured to convert part of the blue light into first luminescent material light having intensity in one or more of the green and yellow having a CIE u' (of the first luminescent material light), and
a second luminescent material configured to convert part of one or more of the blue light and the first luminescent material light into second luminescent material light having intensity in one or more of the orange and red having a CIE u' (of the second luminescent material light),
wherein the first luminescent material and the second luminescent material are selected to provide said first luminescent material light and said second luminescent material light defined by a maximum ratio of CIE u' (of the first luminescent material light) and CIE u' (of the second luminescent material light) being CIE u' (of the second luminescent material light)=1.58*CIE u' (of the first luminescent material light)+0.255, and a minimum ratio of CIE u' (of the first luminescent material light) and CIE u' (of the second luminescent material light) being CIE u' (of the second luminescent material light) =2.3*CIE u' (of the first luminescent material light)+ 0.04, wherein the lighting device is configured to operate at a first setting such that the lighting device produces light having a maximum color temperature of 3500 K.

2. The light emitting device according to claim 1, wherein the first luminescent material and the second luminescent material are selected to provide said first luminescent material light and said second luminescent material light defined by a CIE u' (of the first luminescent material light) in the range of 0.102-0.118 and a CIE u' (of the second luminescent material light) in the range of 0.38-0.415, or by a CIE u' (of the first luminescent material light) in the range of 0.14-0.158 and a CIE u' (of the second luminescent material light) in the range of 0.4-0.44.

3. The light emitting device according to claim 1, wherein the solid state light source has a LED die, wherein the lighting device comprises a light converter comprising said first luminescent material and said second luminescent material, and wherein the light converter is in physical contact with the LED die.

4. The light emitting device according to claim 1, and having a CIE v' of at least 0.005 below the black body locus, and having a CIE v' of at maximum 0.02 below the black body locus.

5. The light emitting device according to claim 3, wherein the lighting device is configured to provide at said first setting of the lighting device white lighting device light having a color rendering index of at least 80.

6. The light emitting device according to claim 3, wherein the lighting device is configured to provide at said first setting of the lighting device white lighting device light having a gamut area index of at least 100.

7. The light emitting device according to claim 1, wherein the solid state light source, the first luminescent material and the second luminescent material are configured to provide a spectral distribution with at least 80% of the power in the spectral region of 380-495 nm in the range of 440-480 nm, at least 80% of the power in the spectral region of 470-650 nm in the range of 485-630 nm, and at least 80% of the power in the spectral region of 570-760 nm in the range of 585-720 nm.

8. The light emitting device according to claim 1, wherein the solid state light source, the first luminescent material and the second luminescent material are configured to provide a spectral distribution with a first maximum selected from the range of 440-450 nm with a full width half maximum selected from the range of 15-30 nm, and a band comprising at least two maxima with a second maximum selected from the range of 515-545 nm and a third maximum selected from the range of 610-630 nm, wherein the band has an intensity of at least 40% of the first maximum over the wavelength range of 500-680 nm.

9. The light emitting device according to claim 1, wherein the first luminescent material comprises $M_3A_5O_{12}:Ce^{3+}$, wherein M is selected from the group consisting of Sc, Y, Tb, Gd, and Lu, wherein A is selected from the group consisting of Al, Ga, Sc and In, and wherein at least one or more of M comprises Lu and A comprises Ga applies.

10. The light emitting device according to claim 1, wherein the first luminescent material comprises a divalent europium comprising luminescent material selected from the group consisting of silicates, chlorosilicates, and beta-sialons.

11. The light emitting device according to claim 1, wherein the second luminescent material comprises $MAlSiN_3:Eu$, wherein M is one or more elements selected from the group consisting of barium, strontium and calcium.

12. The light emitting device according to claim 10, wherein the second luminescent material comprises different $MAlSiN_3:Eu$ compounds, with a first compound with M at least comprising Ca and a second compound with M at least comprising Sr.

13. A lighting device comprising:
a solid state light source configured to provide blue light having a dominant wavelength,
a first luminescent material configured to convert part of the blue light into first luminescent material light having intensity in one or more of the green and yellow having a CIE u' (of the first luminescent material light), and
a second luminescent material configured to convert part of one or more of the blue light and the first luminescent material light into second luminescent material light having intensity in one or more of the orange and red having a CIE u' (of the second luminescent material light),
wherein the first luminescent material and the second luminescent material are selected to provide said first luminescent material light and said second luminescent material light defined by a maximum ratio of CIE u' (of the first luminescent material light) and CIE u' (of the second luminescent material light) being CIE u' (of the second luminescent material light)=1.58*CIE u' (of the first luminescent material light)+0.255, and a minimum ratio of CIE u' (of the first luminescent material light) and CIE u' (of the second luminescent material light) being CIE u' (of the second luminescent material light) =2.3*CIE u' (of the first luminescent material light)+ 0.04, wherein the lighting device is configured to operate at a first setting such that the lighting device produces light having a maximum color temperature of 3500 K;
wherein, the solid state light source is configured to provide blue light having a dominant wavelength selected from the range of 440-470 nm, wherein the first luminescent material has a peak maximum selected from the range of 510-530 nm and a full width half maximum selected from the range of 60-80 nm, and wherein the second luminescent material comprises a first second luminescent material having a first second peak maximum selected from the range of 610-640 and a full width half maximum selected from the range of 60-110 nm and a second luminescent material having a second luminescent material peak maximum selected from the range of 630¬680 nm and having a full width half maximum selected from the range of 60-130 nm, and wherein the first second peak maximum and the second peak maximum differ with at least 10 nm.

14. A lighting system comprising the light emitting device according to claim 1 and a control system configured to control the light emitting device.

15. Use of the light emitting device according to claim 1 in retail or hospitality lighting.

16. A method of providing illumination from a lighting device, the method comprising:
operating the lighting device using a solid state light source configured to provide blue light having a dominant wavelength selected from the ranged of 440-490 nm, such that a first luminescent material arranged to receive at least a part of the blue light is configured to convert part of the blue light into first luminescent material light having intensity in one or more of the green and yellow having a CIE u' (of the first luminescent material light) and a second luminescent material arranged to receive at least a part of the blue light and the first luminescent material light into second luminescent material light having intensity in one or more of the orange and red having CIE u' (of the second luminescent material light)
operating the lighting device such that said first luminescent material light and said second luminescent material light are defined by a maximum ratio of CIE u' (of the first luminescent material light) and CIE u' (of the second luminescent material light) being CIE u' (of the second luminescent material light)=1.58*CIE u' (of the first luminescent material light)+0.255, and a minimum ratio of CIE u' (of the first luminescent material light) and CIE u' (of the second luminescent material light) being CIE u' (of the second luminescent material light) =2.3*CIE u' (of the first luminescent material light)+ 0.04, and
operating the lighting device at a first setting such that the lighting device produces light having a maximum color temperature of 3500 K.

* * * * *